United States Patent
Roy et al.

(10) Patent No.: US 9,449,967 B1
(45) Date of Patent: Sep. 20, 2016

(54) TRANSISTOR ARRAY STRUCTURE (71) Applicant: MIE Fujitsu Semiconductor Limited, Kuwana (JP)

(72) Inventors: Richard S. Roy, Dublin, CA (US); Samuel Leshner, Los Gatos, CA (US)

(73) Assignee: Fujitsu Semiconductor Limited, Yokohama (JP)

( * ) Notice: Subject to any disclaimer, the term of this patent is extended or adjusted under 35 U.S.C. 154(b) by 554 days.

(21) Appl. No.: 13/835,327

(22) Filed: Mar. 15, 2013

(51) Int. Cl.
*G01R 31/00* (2006.01)
*G01R 31/26* (2014.01)
*G11C 7/00* (2006.01)
*H01L 27/088* (2006.01)

(52) U.S. Cl.
CPC .............. *H01L 27/088* (2013.01); *G01R 31/26* (2013.01)

(58) Field of Classification Search
CPC ......... G11C 7/00; G11C 17/00; G11C 17/12; G01R 31/00; G01R 31/26
USPC ......... 365/94, 104, 103, 203, 156, 226, 229; 324/762.01, 762.09, 760.02
See application file for complete search history.

(56) References Cited

U.S. PATENT DOCUMENTS

| | | |
|---|---|---|
| 3,958,266 A | 5/1976 | Athanas |
| 4,000,504 A | 12/1976 | Berger |
| 4,021,835 A | 5/1977 | Etoh et al. |
| 4,242,691 A | 12/1980 | Kotani et al. |
| 4,276,095 A | 6/1981 | Beilstein, Jr. et al. |
| 4,315,781 A | 2/1982 | Henderson |
| 4,578,128 A | 3/1986 | Mundt et al. |
| 4,617,066 A | 10/1986 | Vasudev |
| 4,761,384 A | 8/1988 | Neppl et al. |
| 4,819,043 A | 4/1989 | Yazawa et al. |
| 5,034,337 A | 7/1991 | Mosher et al. |
| 5,144,378 A | 9/1992 | Hikosaka |
| 5,156,989 A | 10/1992 | Williams et al. |

(Continued)

FOREIGN PATENT DOCUMENTS

| | | |
|---|---|---|
| EP | 0274278 A1 | 7/1988 |
| JP | 59-193066 A | 11/1984 |

(Continued)

OTHER PUBLICATIONS

Abiko, H et al., "A Channel Engineering Combined with Channel Epitaxy Optimization and TED Suppression for 0.15μm n-n Gate CMOS Technology", 1995 Symposium on VLSI Technology Digest of Technical Papers, pp. 23-24, 1995.

Chau, R et al., "A 50nm Depleted-Substrate CMOS Transistor (DST)", Electron Device Meeting 2001, IEDM Technical Digest, IEEE International, pp. 29.1.1-29.1.4, 2001.

Ducroquet, F et al. "Fully Depleted Silicon-On-Insulator nMOSFETs with Tensile Strained High Carbon Content Si1-yCy Channel", ECS 210th Meeting, Abstract 1033, 2006.

(Continued)

*Primary Examiner* — Tung X Nguyen
*Assistant Examiner* — Neel Shah
(74) *Attorney, Agent, or Firm* — Baker Botts L.L.P.

(57) ABSTRACT

A semiconductor circuit can include a plurality of arrays of transistors having differing characteristics and operating at low voltages and currents. A drain line drive signal may provide a potential to a drain line to which a selected transistor is connected. A row of drain mux circuits can provide reduced leakage current on the drain line drive signal so that more accurate current measurements may be made. A gate line drive signal may provide a potential to a gate line to which the selected transistor is connected. A column of gate line mux circuits can provide a gate line low drive signal to unselected transistors to reduce leakage current in unselected transistors so that more accurate drain current measurements may be made to the selected transistor.

17 Claims, 6 Drawing Sheets

(56) References Cited

U.S. PATENT DOCUMENTS

| | | |
|---|---|---|
| 5,156,990 A | 10/1992 | Mitchell |
| 5,166,765 A | 11/1992 | Lee et al. |
| 5,208,473 A | 5/1993 | Komori et al. |
| 5,298,763 A | 3/1994 | Shen et al. |
| 5,369,288 A | 11/1994 | Usuki |
| 5,384,476 A | 1/1995 | Nishizawa et al. |
| 5,559,368 A | 9/1996 | Hu et al. |
| 5,608,253 A | 3/1997 | Liu et al. |
| 5,663,583 A | 9/1997 | Matloubian et al. |
| 5,712,501 A | 1/1998 | Davies et al. |
| 5,719,422 A | 2/1998 | Burr et al. |
| 5,726,488 A | 3/1998 | Watanabe et al. |
| 5,780,899 A | 7/1998 | Hu et al. |
| 5,847,419 A | 12/1998 | Imai et al. |
| 5,856,003 A | 1/1999 | Chiu |
| 5,861,334 A | 1/1999 | Rho |
| 5,877,049 A | 3/1999 | Liu et al. |
| 5,889,315 A | 3/1999 | Farrenkopf et al. |
| 5,895,954 A | 4/1999 | Yasumura et al. |
| 5,923,987 A | 7/1999 | Burr |
| 5,989,963 A | 11/1999 | Luning et al. |
| 6,020,227 A | 2/2000 | Bulucea |
| 6,087,210 A | 7/2000 | Sohn |
| 6,087,691 A | 7/2000 | Hamamoto |
| 6,096,611 A | 8/2000 | Wu |
| 6,103,562 A | 8/2000 | Son et al. |
| 6,121,153 A | 9/2000 | Kikkawa |
| 6,147,383 A | 11/2000 | Kuroda |
| 6,157,073 A | 12/2000 | Lehongres |
| 6,175,582 B1 | 1/2001 | Naito et al. |
| 6,184,112 B1 | 2/2001 | Maszara et al. |
| 6,190,979 B1 | 2/2001 | Radens et al. |
| 6,194,259 B1 | 2/2001 | Nayak et al. |
| 6,218,895 B1 | 4/2001 | De et al. |
| 6,229,188 B1 | 5/2001 | Aoki et al. |
| 6,245,618 B1 | 6/2001 | An et al. |
| 6,288,429 B1 | 9/2001 | Iwata et al. |
| 6,300,177 B1 | 10/2001 | Sundaresan et al. |
| 6,313,489 B1 | 11/2001 | Letavic et al. |
| 6,320,222 B1 | 11/2001 | Forbes et al. |
| 6,326,666 B1 | 12/2001 | Bernstein et al. |
| 6,358,806 B1 | 3/2002 | Puchner |
| 6,380,019 B1 | 4/2002 | Yu et al. |
| 6,391,752 B1 | 5/2002 | Colinge et al. |
| 6,426,279 B1 | 7/2002 | Huster et al. |
| 6,444,550 B1 | 9/2002 | Hao et al. |
| 6,444,551 B1 | 9/2002 | Ku et al. |
| 6,461,920 B1 | 10/2002 | Shirahata |
| 6,461,928 B2 | 10/2002 | Rodder |
| 6,472,278 B1 | 10/2002 | Marshall et al. |
| 6,482,714 B1 | 11/2002 | Hieda et al. |
| 6,489,224 B1 | 12/2002 | Burr |
| 6,492,232 B1 | 12/2002 | Tang et al. |
| 6,500,739 B1 | 12/2002 | Wang et al. |
| 6,503,801 B1 | 1/2003 | Rouse et al. |
| 6,506,640 B1 | 1/2003 | Ishida et al. |
| 6,518,623 B1 | 2/2003 | Oda et al. |
| 6,534,373 B1 | 3/2003 | Yu |
| 6,541,829 B2 | 4/2003 | Nishinohara et al. |
| 6,548,842 B1 | 4/2003 | Bulucea et al. |
| 6,551,885 B1 | 4/2003 | Yu |
| 6,573,129 B2 | 6/2003 | Hoke et al. |
| 6,600,200 B1 | 7/2003 | Lustig et al. |
| 6,620,671 B1 | 9/2003 | Wang et al. |
| 6,624,488 B1 | 9/2003 | Kim |
| 6,630,710 B1 | 10/2003 | Augusto |
| 6,660,605 B1 | 12/2003 | Liu |
| 6,667,200 B2 | 12/2003 | Sohn et al. |
| 6,670,260 B1 | 12/2003 | Yu et al. |
| 6,693,333 B1 | 2/2004 | Yu |
| 6,730,568 B2 | 5/2004 | Sohn |
| 6,737,724 B2 | 5/2004 | Hieda et al. |
| 6,743,291 B2 | 6/2004 | Ang et al. |
| 6,753,230 B2 | 6/2004 | Sohn et al. |
| 6,770,944 B2 | 8/2004 | Nishinohara et al. |
| 6,797,994 B1 | 9/2004 | Hoke et al. |
| 9,787,424 | 9/2004 | Yu |
| 6,808,994 B1 | 10/2004 | Wang |
| 6,821,825 B2 | 11/2004 | Todd et al. |
| 6,822,297 B2 | 11/2004 | Nandakumar et al. |
| 6,831,292 B2 | 12/2004 | Currie et al. |
| 6,881,641 B2 | 4/2005 | Wieczorek et al. |
| 6,881,987 B2 | 4/2005 | Sohn |
| 6,893,947 B2 | 5/2005 | Martinez et al. |
| 6,916,698 B2 | 7/2005 | Mocuta et al. |
| 6,930,007 B2 | 8/2005 | Bu et al. |
| 6,930,360 B2 | 8/2005 | Yamauchi et al. |
| 6,963,090 B2 | 11/2005 | Passlack et al. |
| 7,002,214 B1 | 2/2006 | Boyd et al. |
| 7,008,836 B2 | 3/2006 | Algotsson et al. |
| 7,013,359 B1 | 3/2006 | Li |
| 7,015,546 B2 | 3/2006 | Herr et al. |
| 7,057,216 B2 | 6/2006 | Quyang et al. |
| 7,061,058 B2 | 6/2006 | Chakravarthi et al. |
| 7,064,039 B2 | 6/2006 | Liu |
| 7,064,399 B2 | 6/2006 | Babcock et al. |
| 7,071,103 B2 | 7/2006 | Chan et al. |
| 7,078,325 B2 | 7/2006 | Curello et al. |
| 7,078,776 B2 | 7/2006 | Nishinohara et al. |
| 7,089,515 B2 | 8/2006 | Hanafi et al. |
| 7,119,381 B2 | 10/2006 | Passlack |
| 7,170,120 B2 | 1/2007 | Datta et al. |
| 7,186,598 B2 | 3/2007 | Yamauchi et al. |
| 7,189,627 B2 | 3/2007 | Wu et al. |
| 7,199,430 B2 | 4/2007 | Babcock et al. |
| 7,202,517 B2 | 4/2007 | Dixit et al. |
| 7,211,871 B2 | 5/2007 | Cho |
| 7,221,021 B2 | 5/2007 | Wu et al. |
| 7,223,646 B2 | 5/2007 | Miyashita et al. |
| 7,226,833 B2 | 6/2007 | White et al. |
| 7,226,843 B2 | 6/2007 | Weber et al. |
| 7,235,822 B2 | 6/2007 | Li |
| 7,294,877 B2 | 11/2007 | Rueckes et al. |
| 7,297,994 B2 | 11/2007 | Wieczorek et al. |
| 7,301,208 B2 | 11/2007 | Handa et al. |
| 7,304,350 B2 | 12/2007 | Misaki |
| 7,312,500 B2 | 12/2007 | Miyashita et al. |
| 7,323,754 B2 | 1/2008 | Ema et al. |
| 7,332,439 B2 | 2/2008 | Lindert et al. |
| 7,348,629 B2 | 3/2008 | Chu et al. |
| 7,354,833 B2 | 4/2008 | Liaw |
| 7,427,788 B2 | 9/2008 | Li et al. |
| 7,442,971 B2 | 10/2008 | Wirbeleit et al. |
| 7,462,908 B2 | 12/2008 | Bol et al. |
| 7,485,536 B2 | 2/2009 | Jin et al. |
| 7,491,988 B2 | 2/2009 | Tolchinsky et al. |
| 7,494,861 B2 | 2/2009 | Chu et al. |
| 7,498,637 B2 | 3/2009 | Yamaoka et al. |
| 7,501,324 B2 | 3/2009 | Babcock et al. |
| 7,507,999 B2 | 3/2009 | Kusumoto et al. |
| 7,521,323 B2 | 4/2009 | Surdeanu et al. |
| 7,531,393 B2 | 5/2009 | Doyle et al. |
| 7,538,412 B2 | 5/2009 | Schulze et al. |
| 7,564,105 B2 | 7/2009 | Chi et al. |
| 7,592,241 B2 | 9/2009 | Takao |
| 7,598,142 B2 | 10/2009 | Ranade et al. |
| 7,605,041 B2 | 10/2009 | Ema et al. |
| 7,605,060 B2 | 10/2009 | Meunier-Beillard et al. |
| 7,605,429 B2 | 10/2009 | Bernstein et al. |
| 7,608,496 B2 | 10/2009 | Chiu |
| 7,615,802 B2 | 11/2009 | Elpelt et al. |
| 7,622,341 B2 | 11/2009 | Chudzik et al. |
| 7,642,140 B2 | 1/2010 | Bae et al. |
| 7,645,665 B2 | 1/2010 | Kubo et al. |
| 7,651,920 B2 | 1/2010 | Siprak |
| 7,655,523 B2 | 2/2010 | Babcock et al. |
| 7,675,126 B2 | 3/2010 | Cho |
| 7,678,638 B2 | 3/2010 | Chu et al. |
| 7,681,628 B2 | 3/2010 | Joshi et al. |
| 7,682,887 B2 | 3/2010 | Dokumaci et al. |
| 7,683,442 B1 | 3/2010 | Burr et al. |
| 7,696,000 B2 | 4/2010 | Liu et al. |
| 7,704,844 B2 | 4/2010 | Zhu et al. |
| 7,709,828 B2 | 5/2010 | Braithwaite et al. |

(56) References Cited

U.S. PATENT DOCUMENTS

| | | | |
|---|---|---|---|
| 7,723,750 B2 | 5/2010 | Zhu et al. |
| 7,750,405 B2 | 7/2010 | Nowak |
| 7,750,682 B2 | 7/2010 | Bernstein et al. |
| 7,755,146 B2 | 7/2010 | Helm et al. |
| 7,759,714 B2 | 7/2010 | Itoh et al. |
| 7,795,677 B2 | 9/2010 | Bangsaruntip et al. |
| 7,818,702 B2 | 10/2010 | Mandelman et al. |
| 7,829,402 B2 | 11/2010 | Matocha et al. |
| 7,867,835 B2 | 1/2011 | Lee et al. |
| 7,883,977 B2 | 2/2011 | Babcock et al. |
| 7,888,747 B2 | 2/2011 | Hokazono |
| 7,897,495 B2 | 3/2011 | Ye et al. |
| 7,906,413 B2 | 3/2011 | Cardone et al. |
| 7,906,813 B2 | 3/2011 | Kato |
| 7,919,791 B2 | 4/2011 | Flynn et al. |
| 7,948,008 B2 | 5/2011 | Liu et al. |
| 7,952,147 B2 | 5/2011 | Ueno et al. |
| 7,960,232 B2 | 6/2011 | King et al. |
| 7,960,238 B2 | 6/2011 | Kohli et al. |
| 7,968,400 B2 | 6/2011 | Cai |
| 7,968,411 B2 | 6/2011 | Williford |
| 8,004,024 B2 | 8/2011 | Furukawa et al. |
| 8,012,827 B2 | 9/2011 | Yu et al. |
| 8,039,332 B2 | 10/2011 | Bernard et al. |
| 8,048,791 B2 | 11/2011 | Hargrove et al. |
| 8,048,810 B2 | 11/2011 | Tsai et al. |
| 8,067,279 B2 | 11/2011 | Sadra et al. |
| 8,105,891 B2 | 1/2012 | Yeh et al. |
| 8,106,424 B2 | 1/2012 | Schruefer |
| 8,106,481 B2 | 1/2012 | Rao |
| 8,119,482 B2 | 2/2012 | Bhalla et al. |
| 8,120,069 B2 | 2/2012 | Hynecek |
| 8,129,246 B2 | 3/2012 | Babcock et al. |
| 8,129,797 B2 | 3/2012 | Chen et al. |
| 8,134,159 B2 | 3/2012 | Hokazono |
| 8,143,120 B2 | 3/2012 | Kerr et al. |
| 8,143,124 B2 | 3/2012 | Challa et al. |
| 8,143,678 B2 | 3/2012 | Kim et al. |
| 8,148,774 B2 | 4/2012 | Mori et al. |
| 8,163,619 B2 | 4/2012 | Yang et al. |
| 8,173,502 B2 | 5/2012 | Yan et al. |
| 8,178,430 B2 | 5/2012 | Kim et al. |
| 8,183,096 B2 | 5/2012 | Wirbeleit |
| 8,183,107 B2 | 5/2012 | Mathur et al. |
| 8,236,661 B2 | 8/2012 | Dennard et al. |
| 2001/0014495 A1 | 8/2001 | Yu |
| 2003/0122203 A1 | 7/2003 | Nishinohara et al. |
| 2003/0183856 A1 | 10/2003 | Wieczorek et al. |
| 2003/0202374 A1* | 10/2003 | Hayashi | G11C 17/12 365/104 |
| 2004/0075118 A1 | 4/2004 | Heinemann et al. |
| 2004/0084731 A1 | 5/2004 | Matsuda et al. |
| 2005/0116282 A1 | 6/2005 | Pattanayak et al. |
| 2005/0250289 A1 | 11/2005 | Babcock et al. |
| 2006/0022270 A1 | 2/2006 | Boyd et al. |
| 2006/0049464 A1 | 3/2006 | Rao |
| 2006/0068555 A1 | 3/2006 | Zhu et al. |
| 2006/0068586 A1 | 3/2006 | Pain |
| 2006/0071278 A1 | 4/2006 | Takao |
| 2006/0154428 A1 | 7/2006 | Dokumaci |
| 2006/0284633 A1* | 12/2006 | Park | G09G 3/006 324/760.02 |
| 2007/0040222 A1 | 2/2007 | Van Camp et al. |
| 2007/0158790 A1 | 7/2007 | Rao |
| 2007/0238253 A1 | 10/2007 | Tucker |
| 2008/0067589 A1 | 3/2008 | Ito et al. |
| 2008/0169493 A1 | 7/2008 | Lee et al. |
| 2008/0197439 A1 | 8/2008 | Goerlach et al. |
| 2008/0227250 A1 | 9/2008 | Ranade et al. |
| 2008/0258198 A1 | 10/2008 | Bojarczuk et al. |
| 2008/0272409 A1 | 11/2008 | Sonkusale et al. |
| 2009/0057746 A1 | 3/2009 | Sugll et al. |
| 2009/0108350 A1 | 4/2009 | Cai et al. |
| 2009/0134468 A1 | 5/2009 | Tsuchiya et al. |
| 2009/0302388 A1 | 12/2009 | Cai et al. |
| 2009/0311837 A1 | 12/2009 | Kapoor |
| 2009/0321849 A1 | 12/2009 | Miyamura et al. |
| 2010/0012988 A1 | 1/2010 | Yang et al. |
| 2010/0038724 A1 | 2/2010 | Anderson et al. |
| 2010/0187641 A1 | 7/2010 | Zhu et al. |
| 2011/0073961 A1 | 3/2011 | Dennard et al. |
| 2011/0074498 A1 | 3/2011 | Thompson et al. |
| 2011/0079860 A1 | 4/2011 | Verhulst |
| 2011/0079861 A1 | 4/2011 | Shifren et al. |
| 2011/0169082 A1 | 7/2011 | Zhu et al. |
| 2011/0175170 A1 | 7/2011 | Wang et al. |
| 2011/0180880 A1 | 7/2011 | Chudzik et al. |
| 2011/0193164 A1 | 8/2011 | Zhu |
| 2012/0021594 A1 | 1/2012 | Gurtei et al. |
| 2012/0056275 A1 | 3/2012 | Cai et al. |
| 2012/0108050 A1 | 5/2012 | Chen et al. |
| 2012/0190177 A1 | 7/2012 | Kim et al. |

FOREIGN PATENT DOCUMENTS

| | | |
|---|---|---|
| JP | 4-186774 A | 7/1992 |
| JP | 8-153873 A | 6/1996 |
| JP | 8-288508 A | 11/1996 |
| JP | 2004087671 A | 3/2004 |
| WO | 2011/062788 A1 | 5/2011 |

OTHER PUBLICATIONS

Ernst, T et al., "Nanoscaled MOSFET Transistors on Strained Si, SiGe, Ge Layers: Some Integration and Electrical Properties Features", ECS Trans. 2006, vol. 3, Issue 7, pp. 947-961, 2006.

Goesele, U et al., Diffusion Engineering by Carbon in Silicon, Mat. Res. Soc. Symp. vol. 610, 2000.

Hokazono, A et al., "Steep Channel & Halo Profiles Utilizing Boron-Diffusion-Barrier Layers (Si:C) for 32 nm Node and Beyond", 2008 Symposium on VLSI Technology Digest of Technical Papers, pp. 112-113, 2008.

Hokazono, A et al., "Steep Channel Profiles in n/pMOS Controlled by Boron-Doped Si:C Layers for Continual Bulk-CMOS Scaling", IEDM09-676 Symposium, pp. 29.1.1-29.1.4, 2009.

Holland, OW and Thomas, DK "A Method to Improve Activation of Implanted Dopants in SiC", Oak Ridge National Laboratory, Oak Ridge, TN, 2001.

Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", IEDM 96, pp. 459-462, 1996.

Lavéant, P. "Incorporation, Diffusion and Agglomeration of Carbon in Silicon", Solid State Phenomena, vols. 82-84, pp. 189-194, 2002.

Noda, K et al., "A 0.1-μm Delta-Doped MOSFET Fabricated with Post-Low-Energy Implanting Selective Epitaxy" IEEE Transactions on Electron Devices, vol. 45, No. 4, pp. 809 -814, Apr. 1998.

Ohguro, T et al., "An 0.18-μm CMOS for Mixed Digital and Analog Aplications with Zero-Volt-Vth Epitaxial-Channel MOSFET's", IEEE Transactions on Electron Devices, vol. 46, No. 7, pp. 1378 -1383, Jul. 1999.

Pinacho, R et al., "Carbon in Silicon: Modeling of Diffusion and Clustering Mechanisms", Journal of Applied Physics, vol. 92, No. 3, pp. 1582-1588, Aug. 2002.

Robertson, LS et al., "The Effect of Impurities on Diffusion and Activation of Ion Implanted Boron in Silicon", Mat. Res. Soc. Symp. vol. 610, 2000.

Scholz, R et al., "Carbon-Induced Undersaturation of Silicon Self-Interstitials", Appl. Phys. Lett. 72(2), pp. 200-202, Jan. 1998.

Scholz, RF et al., "The Contribution of Vacancies to Carbon Out-Diffusion in Silicon", Appl. Phys. Lett., vol. 74, No. 3, pp. 392-394, Jan. 1999.

Stolk, PA et al., "Physical Mechanisms of Transient Enhanced Dopant Diffusion in Ion-Implanted Silicon", J. Appl. Phys. 81(9), pp. 6031-6050, May 1997.

Thompson, S et al., "MOS Scaling: Transistor Challenges for the 21st Century", Intel Technology Journal Q3' 1998, pp. 1-19, 1998.

Wann, C. et al., "Channel Profile Optimization and Device Design for Low-Power High-Performance Dynamic-Threshold MOSFET", IEDM 96, pp. 113-116, 1996.

(56) References Cited

OTHER PUBLICATIONS

Werner, P. et al., "Carbon Diffusion in Silicon", Applied Physics Letters, vol. 73, No. 17, pp. 2465-2467, Oct. 1998.

Yan, Ran-Hong et al., "Scaling the Si MOSFET: From Bulk to SOI to Bulk", IEEE Transactions on Electron Devices, vol. 39, No. 7, Jul. 1992.

* cited by examiner

| | | ARRAY TYPE | |
|---|---|---|---|
| | | N-TYPE | P-TYPE |
| MUX | Signals/supplies | Potential (Volt) | Potential (Volt) |
| DRAIN | GDDRV | 0.1, 0.9 | 0.8, 0.0 |
| | DTRACK | 0.1, 0.9 | 0.8, 0.0 |
| | VDD1 | 0.9 | 0.9 |
| | VSS1 | 0.0 | 0.0 |
| | Vbp1 | 0.9 | 0.9 |
| | Vbn1 | 0.0 | 0.0 |
| GATE | GDRV | 0 to 0.9 volt | 0.9 to 0.0 volt |
| | GTRACK | -0.3 | 1.2 |
| | VDD2 | 1.2 | 1.2 |
| | VSS2 | -0.3 | -0.1 |
| | Vbp2 | 1.2 | 1.5 |
| | Vbn2 | -0.3 | -0.4 |

| IDD Actual | IDD At Pad | GDRV at Pad | VG Actual |
|---|---|---|---|
| 4.993 uA | 5.005 uA | 0.3072 V | 0.3072 V |
| 1.0015 uA | 1.0031 uA | 0.2146 V | 0.2146 V |
| 98.77 uA | 100.08 nA | 0.05023 V | 0.05011 V |

TRANSISTOR ARRAY STRUCTURE

TECHNICAL FIELD

The present invention relates generally to array structures, and more particularly to an array structure that may improve transistor characteristic measurement accuracy.

BACKGROUND OF THE INVENTION

Process variations can cause component characteristics on a semiconductor device to greatly vary. Test structures may be constructed to test operating characteristics of devices such as insulated gate field effect transistors (IGFETs). However, as devices operate at lower voltages and currents, measurements may be distorted by leakage currents in current paths other than the desired path of the device under test (DUT).

In view of the above, it would be desirable to provide a way of reducing or eliminating leakage currents in a device, such as an IGFET being tested.

DETAILED DESCRIPTION OF THE EMBODIMENTS

Various embodiments of the present invention will now be described in detail with reference to a number of drawings. The embodiments show transistor array circuits and methods constructed with insulated gate field effect transistors (IGFETs), for example IGFETs of complementary conductivity types (n-channel and p-channel types). In particular, the embodiments may include implementations using IGFETs having substantially lower absolute value of threshold voltage $V_T$, e.g. about 0.4 volts for n-channel IGFETs and about −0.4 volts for p-channel IGFETs as compared to about 0.6 volts and −0.6 volts, respectively. Such low threshold voltage IGFETs may comprise DDC technology, as but one example. DDC transistors are particularly advantageous for the embodiments herein based on the ability to reliably set threshold voltage with substantially reduced variation compared with conventional planar CMOS transistors. DDC transistors are also amenable to be designed with reduced threshold voltage, based upon, among other device design attributes, there being a heavily doped region and structure below a substantially undoped channel. Further discussion regarding transistor structure and methods of implementation is provided in U.S. Pat. No. 8,273,617 entitled ELECTRONIC DEVICES AND SYSTEMS, AND METHODS FOR MAKING AND USING THE SAME, which disclosure is incorporated by reference herein in its entirety. Such low threshold voltage IGFETs may be based upon a different transistor design, such as a design that is not planar but three-dimensional. Such low threshold voltage IFGETs may be produced on bulk silicon or on a substrate that has an insulating layer embedded therein.

Figure 1:
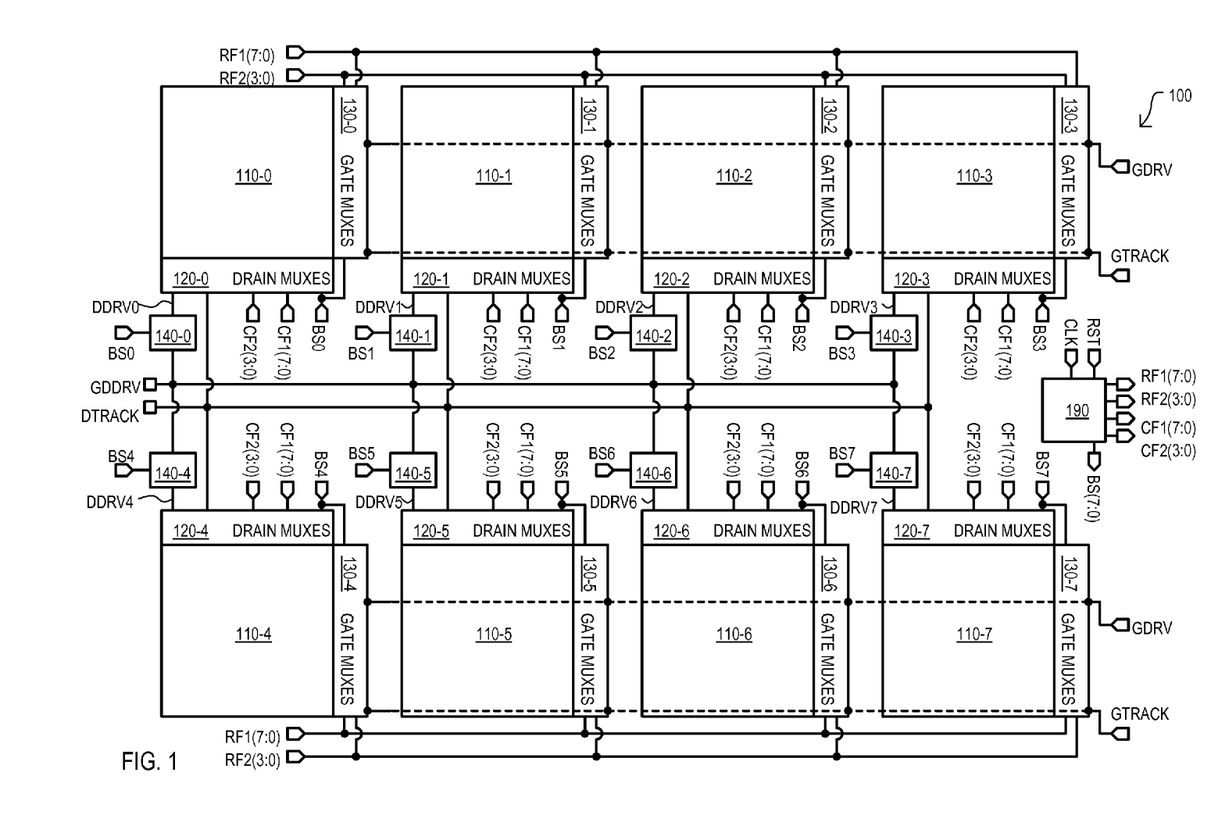
FIG. 1 is a schematic diagram of a semiconductor circuit according to a first embodiment.

Referring now to FIG. 1, a semiconductor circuit according to a first embodiment is set forth in a block schematic diagram, and designated by the general reference character 100. Semiconductor circuit 100 can include arrays (110-0 to 110-7). Each array (110-0 to 110-7) has a corresponding column of gate mux (multiplexer) circuits (130-0 to 130-7), row of drain mux circuits (120-0 to 120-7), and array drain drive circuits (140-0 to 140-7).

Each row of drain mux circuits (120-0 to 120-7) may receive column factor signals (CF1(7:0) and CF2(3:0)) and corresponding bank select signal (BS0 to BS7). Each column of drain mux circuits (120-0 to 120-7) may also receive a respective drain drive signal (DDRV0 to DDRV7) and a drain current reduction signal DTRACK.

Each column of gate mux circuits (130-0 to 130-7) may receive row factor signals (RF1(7:0) and RF2(3:0)) and corresponding bank select signal (BS0 to BS7). Each row of gate mux circuits (130-0 to 130-7) may also receive a gate drive signal GDRV and a gate line low drive signal GTRACK.

Array drain drive circuit (140-0 to 140-7) may receive a global drain drive signal GDDRV and may provide a local drain drive signal (DDRV0 to DDRV7), respectively to respective row of drain mux circuits (120-0 to 120-7).

Semiconductor circuit 100 may include an address generator 190. Address generator 190 may receive a clock signal CLK and a reset signal RST and may provide column factor signals (CF1(7:0) and CF2(3:0)), row factors (RF1(7:0) and RF2(3:0)), and bank select signal (BS7:0). Address generator 190 may be a clocked counter.

Figure 2:
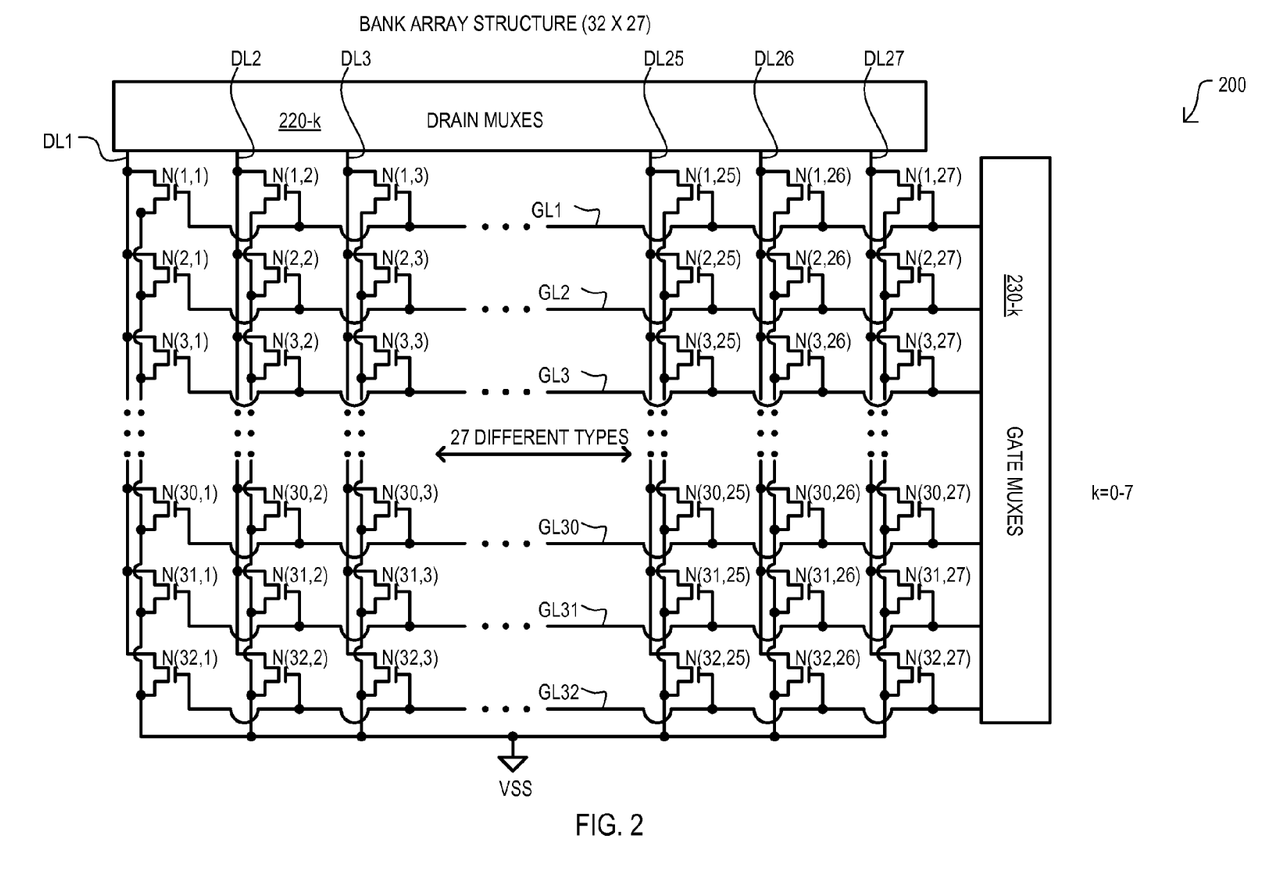
FIG. 2 is a circuit schematic diagram of an array of transistors according to an embodiment.

Referring now to FIG. 2, a circuit schematic diagram of an array according to an embodiment is set forth and given the general reference character 200. Array 200 can include transistors (N(1,1) to N(32,27)) arranged in a 32×27 matrix. Each transistor (N(1,1) to N(32,27)) may include a source terminal connected to ground a potential VSS, a gate connected to a respective gate line (GL-1 to GL-32), and a drain connected to a respective drain line (DL-1 to DL-27). For instance, transistor N(3,25) may have a gate connected to gate line GL3 in common with transistors (N(3,1) to N(3,24) (not shown), N(3,26) and N(3,27)) and a drain connected to drain line DL25 in common with transistors (N(1,25), N(2, 25), and N(4,25) (not shown) to N(32,25)). Likewise, each transistor (N(1,1) to N(32,27)) can have a drain commonly connected with the drains of 31 other transistors along the same column and gates connected with the gates of 26 other transistors along the same row.

Each drain line (DL-1 to DL-27) may be connected to a row of drain mux circuits 220-k and each gate line (GL-1 to GL-32) may be connected to a column of gate mux circuits 230-k, where k=0-7 and denotes the array (110-0 to 110-7) that a bank select signal (BS0-7) selects (FIG. 1).

Array 200 may have 27 different types of transistors (i.e. different sizes, implant dopings, geometries, etc.) in the gate line (GL-1 to GL-32) direction. In this way, characteristics for different transistor types can be tested in each array. By having 32 transistors in each column connected to each drain line (DL-1 to DL-27), characteristic variations for same transistor types may be tested. Such variations may be caused by process variations or close proximity affects, for instance.

Figure 3:
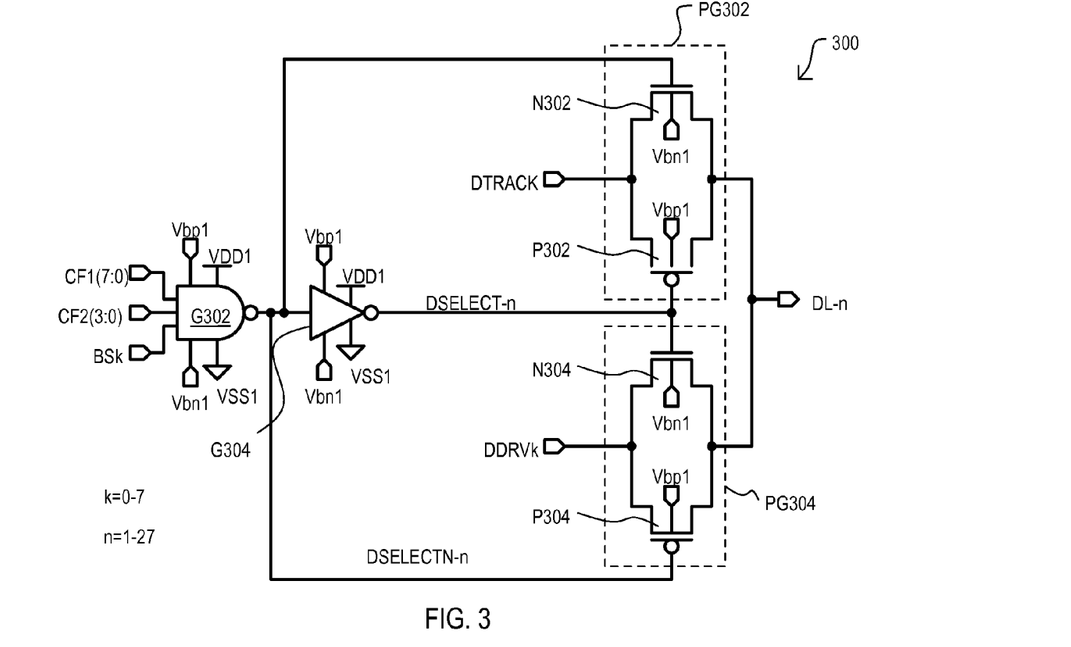
FIG. 3 is a circuit schematic diagram of drain mux circuit according to an embodiment.

Referring now to FIG. 3, a circuit schematic diagram of a drain mux circuit according to an embodiment is set forth and designated by the general reference character 300. In each drain mux circuit 220-k of FIG. 2, there can be one drain mux circuit 300 for each drain line (DL-1 to DL-27). For instance, in array 200 of FIG. 2, there may be 27 drain mux circuits 300 in row of drain mux circuits 220-k.

Drain mux circuit 300 may receive column factor signals (CF1(7:0) and CF2(3:0)) and bank select signal BSk, drain drive signal DDRVk, and drain current reduction signal DTRACK. It is understood that only one of the column factor signals (CF1(7:0) and one of the column factor signals (CF2(3:0)) may be used per drain mux circuit 300 in accordance with the proper address decoding.

Drain mux circuit 300 may include logic gates (G302 and G304) and pass gates (PG302 and PG304). Logic gate G302 can receive column factors signals (CF1(7:0) and CF2(3:0)), and bank select signal BSk as inputs and may provide a data line select complement signal DSELECTN-n as an output. Logic gate G302 may be a NAND logic gate. Logic gate G304 may receive data line select complement signal DSELECTN-n and may provide a data line select signal DSELECT-n. Logic gate G304 may be an inverter logic gate. Logic gates (G302 and G304) may include complementary conductive type IGFETs with the p-channel IGFETs receiving a body bias potential Vbp1 at a body terminal and n-channel IGFETs receiving a body bias potential Vbn1 at a body terminal. Logic gates (G302 and G304) may receive a power supply potential VDD1 and a ground potential VSS1.

Pass gate PG302 may receive drain current reduction signal DTRACK, data line select signal DSELECT-n, and data line select complement signal DSELECTN-n as inputs and may have an output coupled to a drain line DL-n. Pass gate PG302 can include transistors (P302 and N302). Transistor P302 may be p-channel IGFET and transistor N302 may be an n-channel IGFET N302. Transistor P302 may provide a controllable impedance path between source and drain terminals connected between drain current reduction signal DTRACK and data line DL-n. Transistor P302 may receive data line select signal DSELECT-n at a gate terminal and a body bias voltage Vbp1 at a body bias terminal. Transistor N302 may be connected in parallel with transistor P302 to provide a controllable impedance path between source and drain terminals connected between drain current reduction signal DTRACK and data line DL-n. Transistor N302 may receive data line select complement signal DSELECTN-n at a gate terminal and a body bias voltage Vbn1 at a body bias terminal.

Pass gate PG304 may receive local drain drive signal DDRVk, data line select signal DSELECT-n, and data line select complement signal DSELECTN-n as inputs and may have an output coupled to a drain line DL-n. Pass gate PG304 can include transistors (P304 and N304). Transistor P304 may be p-channel IGFET and transistor N304 may be an n-channel IGFET N304. Transistor P304 may provide a controllable impedance path between source and drain terminals connected between local drain drive signal DDRVk and data line DL-n. Transistor P304 may receive data line select complement signal DSELECTN-n at a gate terminal and a body bias voltage Vbp1 at a body bias terminal. Transistor N304 may be connected in parallel with transistor P304 to provide a controllable impedance path between source and drain terminals connected between local drain drive signal DDRVk and data line DL-n. Transistor N304 may receive data line select signal DSELECT-n at a gate terminal and a body bias voltage Vbn1 at a body bias terminal.

Figure 4:
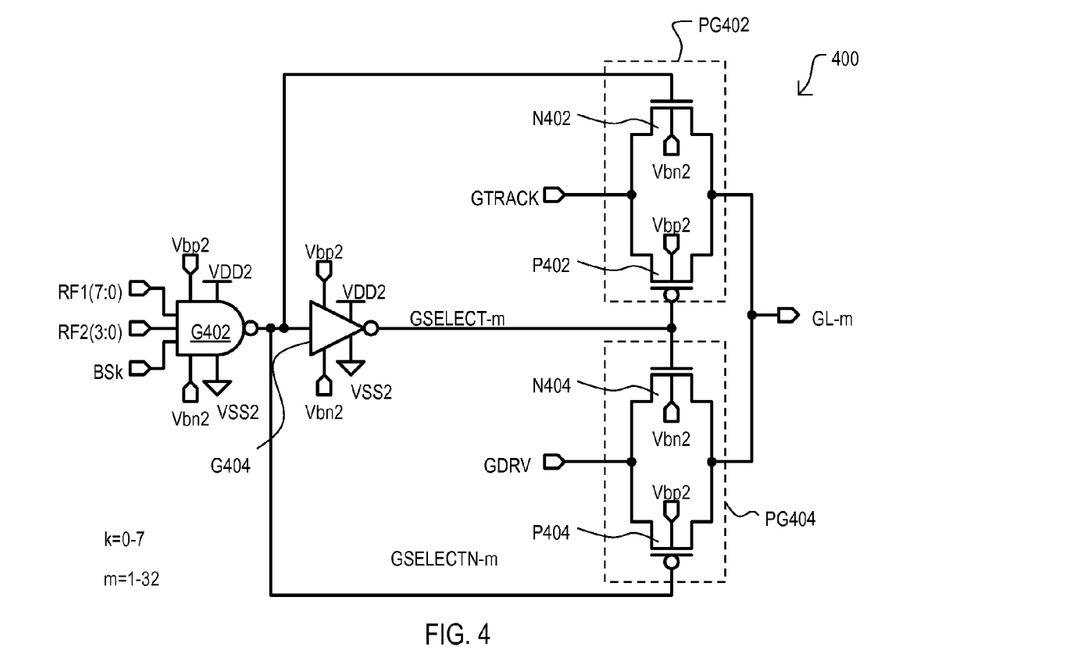
FIG. 4 is a circuit schematic diagram of gate mux circuit according to an embodiment.

Referring now to FIG. 4, a gate mux circuit according to an embodiment is set forth and designated by the general reference character 400. In each gate mux circuit 230-k of FIG. 2, there can be one gate mux circuit 400 for each gate line (GL-1 to GL-32). For instance, in array 200 of FIG. 2, there may be 32 gate mux circuits 400.

Gate mux circuit 400 may receive row factor signals (RF1(7:0) and RF2(3:0)) and bank select signal BSk, gate drive signal GDRV, and gate line low drive signal GTRACK. It is understood that only one of the row factor signals (RF1(7:0) and one of the row factor signals (RF2(3:0)) may be used per gate mux circuit 400 in accordance with the proper address decoding.

Gate mux circuit 400 may include logic gates (G402 and G404) and pass gates (PG402 and PG404). Logic gate G402 can receive row factors signals (RF1(7:0) and RF2(3:0)), and bank select signal BSk as inputs and may provide a gate line select signal GSELECT-m as an output. Logic gate G402 may be a NAND logic gate. Logic gate G404 may receive gate line select signal GSELECT-m and may provide a gate line select complement signal GSELECTN-m. Logic gate G404 may be an inverter logic gate. Logic gates (G402 and G404) may include complementary conductive type IGFETs with the p-channel IGFETs receiving a body bias potential Vbp2 at a body terminal and n-channel IGFETs receiving a body bias potential Vbn2 at a body terminal. Logic gates (G402 and G404) may receive a power supply potential VDD2 and a ground potential VSS2.

Pass gate PG402 may receive gate line low drive signal GTRACK, gate line select signal GSELECT-m, and gate line select complement signal GSELECTN-m as inputs and may have an output coupled to a gate line GL-m. Pass gate PG402 can include transistors (P402 and N402). Transistor P402 may be p-channel IGFET and transistor N402 may be an n-channel IGFET. Transistor P402 may provide a controllable impedance path between source and drain terminals connected between gate line low drive signal GTRACK and gate line GL-m. Transistor P402 may receive gate line select signal GSELECT-m at a gate terminal and a body bias voltage Vbp2 at a body bias terminal. Transistor N402 may be connected in parallel with transistor P402 to provide a controllable impedance path between source and drain terminals connected between gate line low drive signal GTRACK and gate line GL-m. Transistor N402 may receive gate line select complement signal GSELECTN-m at a gate terminal and a body bias voltage Vbn2 at a body bias terminal.

Pass gate PG404 may receive gate drive signal GDRV, gate line select signal GSELECT-m, and gate line select complement signal GSELECTN-m as inputs and may have an output coupled to a gate line GL-m. Pass gate PG404 can include transistors (P404 and N404). Transistor P404 may be p-channel IGFET and transistor N404 may be an n-channel IGFET. Transistor P404 may provide a controllable impedance path between source and drain terminals connected between gate drive signal GDRV and gate line GL-m. Transistor P404 may receive gate line select complement signal GSELECTN-m at a gate terminal and a body bias voltage Vbp2 at a body bias terminal. Transistor N404 may be connected in parallel with transistor P404 to provide a controllable impedance path between source and drain terminals connected between gate drive signal GDRV and gate line GL-m. Transistor N404 may receive gate line select signal GSELECT-m at a gate terminal and a body bias voltage Vbn2 at a body bias terminal.

Figure 5:
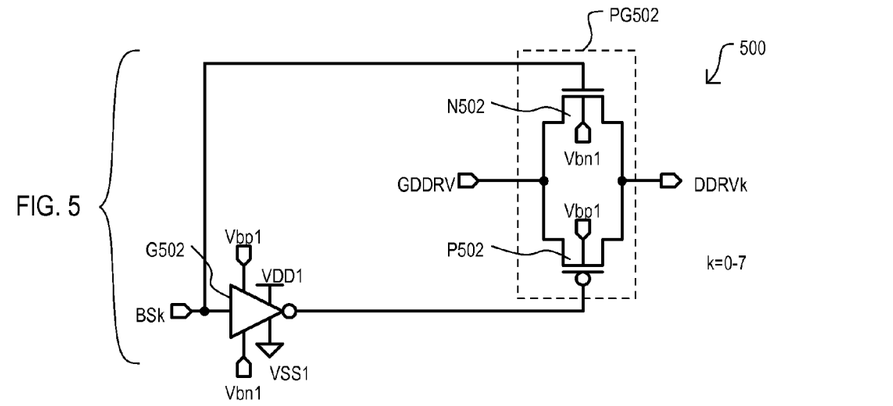
FIG. 5 is a circuit schematic diagram of an array drain drive circuit according to an embodiment.

Referring now to FIG. 5, a circuit schematic diagram of an array drain drive circuit according to an embodiment is set forth and designated by the general reference character 500. Array drain drive circuit 500 may be used as array drain drive circuit (140-0 to 140-7) in semiconductor circuit 100 of FIG. 1.

Array drain drive circuit 500 may receive bank select signal BSk and global drain drive signal GDDRV as inputs and may have an output connected to provide local drain drive signal DDRVk. Array drain drive circuit 500 may include a logic gate G502 and a pass gate PG502.

Logic gate G502 may receive bank select signal BSk as an input and may provide an output. Logic gate G502 may be an inverter. Logic gate G502 may include complementary conductive type IGFETs with the p-channel IGFETs receiving a body bias potential Vbp1 at a body terminal and n-channel IGFETs receiving a body bias potential Vbn1 at a body terminal. Logic gate G502 may receive a power supply potential VDD1 and a ground potential VSS1.

Pass gate PG502 may receive bank select signal BSk, the output of inverter G502, and global drain drive signal GDDRV as inputs and may have an output coupled to provide local drain drive signal DDRVk. Pass gate PG502 can include transistors (P502 and N502). Transistor P502 may be p-channel IGFET and transistor N502 may be an n-channel IGFET. Transistor P502 may provide a controllable impedance path between source and drain terminals connected between global drain drive signal GDDRV and local drain drive signal DDRVk. Transistor P502 may receive the output of logic gate G502 at a gate terminal and a body bias voltage Vbp1 at a body bias terminal. Transistor N502 may be connected in parallel with transistor P502 to provide a controllable impedance path between source and drain terminals connected between between global drain drive signal GDDRV and local drain drive signal DDRVk. Transistor N502 may receive bank select signal BSk at a gate terminal and a body bias voltage Vbn1 at a body bias terminal.

The operation of semiconductor circuit 100 of FIG. 1 will now be discussed with reference to FIGS. 1 to 5. In the example, bank 110-1 may be activated and transistor N(30, 25) in array 200 of FIG. 2 will be selected.

Bank select signal BS1 may transition to a high logic level to activate bank 110-1. The predetermined set of two row factors (RF1(7:0) and RF2(3:0)) uniquely received by gate G402 of gate mux circuit 400 (each of the other gate mux circuits 400 in column of gate mux circuits 130-1, receive a different unique combination of two row factors (RF1(7:0) and RF2(3:0))) may be at a high logic level. In this way, logic gate G402 may provide a gate line select complement signal GSELECTN-m, in this case m=30, having a logic low level and logic gate G404 may provide a gate line select signal GSELECT-m having a logic high level. With gate line select signal GSELECT-m at a logic high level, pass gate PG402 may be turned off and pass gate PG404 may be turned on and a low impedance path may be provided between gate drive signal GDRV and gate line GL-m, where m=30. In this way gate line GL-30 may be driven by gate drive signal GDRV through pass gate PG404.

All the other gate mux circuits 400 in column of gate mux circuits 130-1 that drive gate lines (GL-1 to GL-29, GL-31, and GL32) provide a gate line select signal GSELECT-m at a logic low level. With gate line select signal GSELECT-m at a logic low level, pass gate PG402 may be turned on and pass gate PG404 may be turned off and a low impedance path may be provided between gate line low drive signal GTRACK and gate line GL-m, where m=1=29, 31 and 32). In this way gate lines (GL-1 to GL-29, GL-31, and GL32) may be driven by gate line low drive signal GTRACK through pass gate PG402.

With bank select signal BS1 at a logic high level, pass gate PG502 in drive mux circuit 500 may be turned on and a low impedance path may be provided between global drain drive signal GDDRV and local drain drive signal DDRV1.

The predetermined set of two column factors (CF1(7:0) and CF2(3:0)) uniquely received by gate G302 of drain mux circuit 300 (each of the other drain mux circuits 300 in row of column mux circuits 120-1, receive a different unique combination of two column factors (CF1(7:0) and CF2(3:0))) may be at a high logic level. In this way, logic gate G302 may provide a drain line select complement signal DSELECTN-n, in this case m=25, having a logic low level and logic gate G304 may provide a drain line select signal DSELECT-n having a logic high level. With drain line select signal DSELECT-n at a logic high level, pass gate PG302 may be turned off and pass gate PG304 may be turned on and a low impedance path may be provided between local drain drive signal DDRV1 and drain line DL-n, where n=25. In this way gate line DL-25 may be driven by global drain drive signal GDDRV through pass gates PG502 and PG304.

All the other drain mux circuits 300 in row of drain mux circuits 120-1 that drive drain lines (DL-1 to DL-24, DL-26, and DL27) provide a drain line select signal DSELECT-n at a logic low level. With drain line select signal DSELECT-n at a logic low level, pass gate PG302 may be turned on and pass gate PG304 may be turned off and a low impedance path may be provided drain current reduction signal DTRACK and gate line DL-n, where n=1-24, 26, and 27). In this way drain lines (DL-1 to DL-24, DL-26, and DL27) may be driven by drain current reduction signal DTRACK through pass gate PG302.

As described above, the column of drain mux circuits 120-k may operate to drive a selected drain line DL-25 with a global drain drive signal GDDRV by way of pass gates (PG502 and PG304) while driving unselected drain lines (DL-1 to DL-24, DL-26, and DL27) with a drain current reduction signal DTRACK through pass gate PG302. In this way, a potential drop across the unselected pass gates PG304 (e.g. the 26 unselected pass gates PG304) connected to local drain drive signal DDRVk may be reduced to zero thereby eliminating or significantly reducing channel leakage currents to unselected columns. By reducing the potential across the unselected pass gates, a drive current through drain drive signal GDDRV may more accurately represent the actual drain current in selected transistor N(30,25). In this way, testing characteristics of a selected transistor N(30,25) can be more accurately performed.

For transistors operating with extremely low currents, for example low voltage IGFETs, such as FINFETs, DDC transistors, and/or transistors operating in subthreshold regions, the reduction of alternate leakage current paths may be particularly necessary to provide accurate current measurements.

In yet another feature, the row of gate mux circuits 130-k may operate to drive a selected gate line GL-30 with a gate drive signal GDRV by way of pass gate PG404 while driving unselected gate lines (GL-1 to GL-29, GL-31, and DL-32) with a gate line low drive signal GTRACK through pass gate PG402. In this way, a gate potential of unselected transistors (e.g. the 31 unselected transistors (N(1,25) to N(29,25), N(31,25), and N(32,25) along drain line DL25) may be set to a potential below ground potential VSS. The low gate potential may provide a substantially higher impedance path through the unselected transistors (N(1,25) to N(29,25), N(31,25), and N(32,25) along drain line DL25) and leakage current along drain line DL-25 may be substantially reduced. In this way, testing characteristics of a selected transistor N(30,25) can be more accurately performed.

Figure 6:
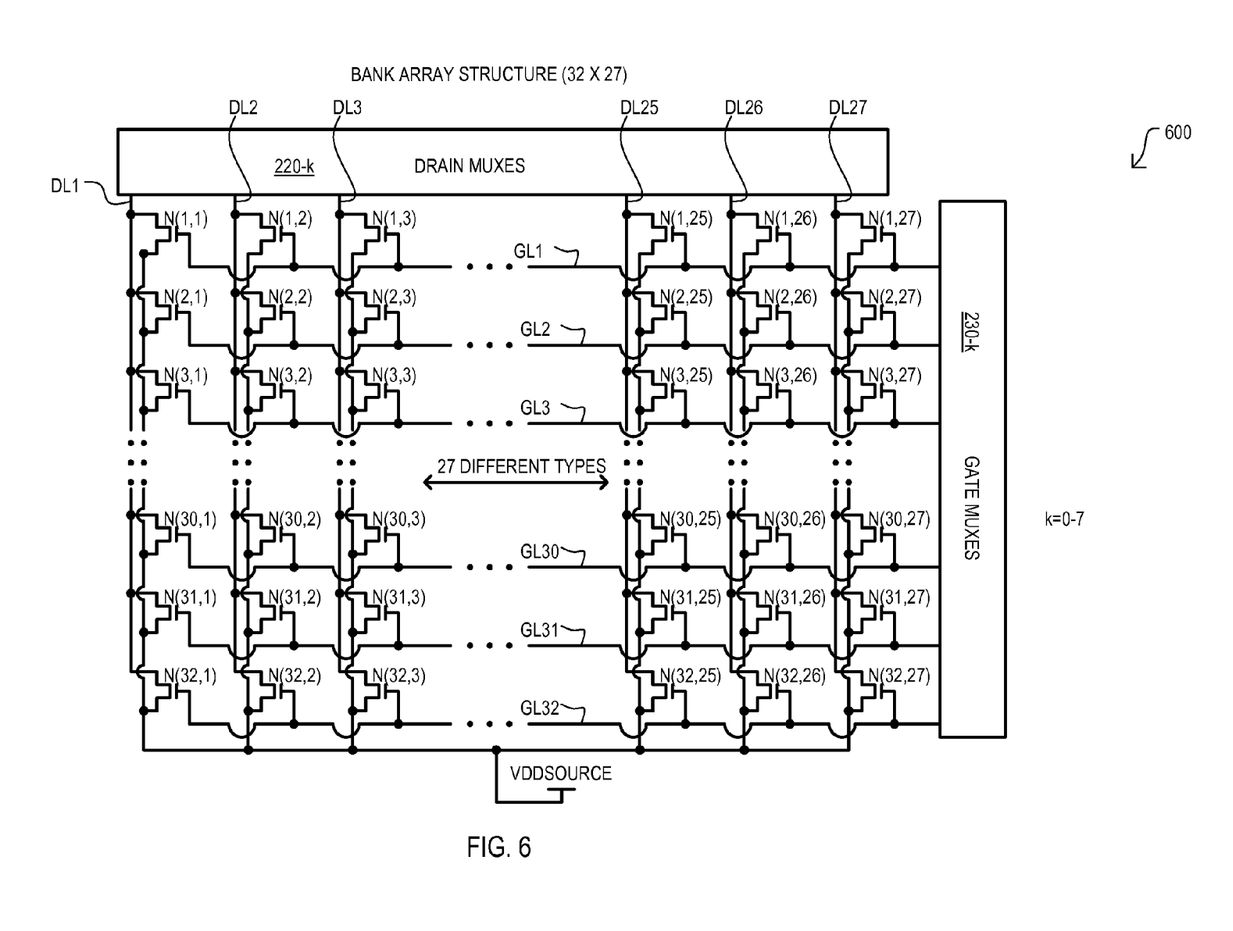
FIG. 6 is a circuit schematic diagram of an array of transistors according to an embodiment.

Referring now to FIG. 6, a circuit schematic diagram of an array according to an embodiment is set forth and given the general reference character 600.

Array 600 of FIG. 6 may differ from array 200 of FIG. 2 in that transistors (N(1,1) to N(32,27)) can be p-channel IGFETs. In this configuration, the common sources of the transistors (N(1,1) to N(32,27)) may be connected to a power supply potential VDDSOURCE. Note that with back bias potentials (Vbn1 and Vbn2) normally separated between the column and row paths, in the embodiment tying the two voltages together improves the test accuracy for drain current IDD and gate voltages VG.

Figure 7:
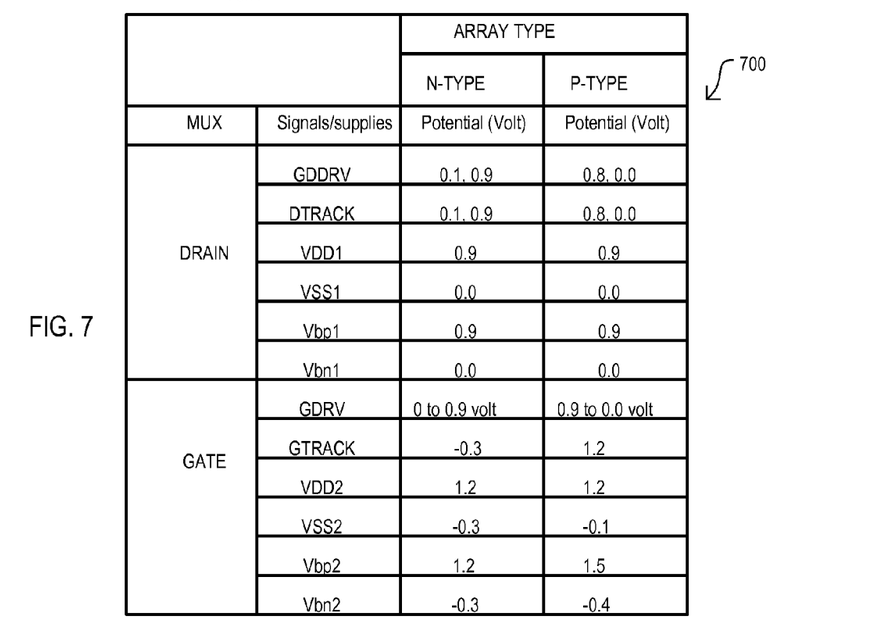
FIG. 7 is a table showing potentials in which various signals and power supplies may be set when testing current characteristics of transistors according to an embodiment.

Referring now to FIG. 7, a table is set forth and designated by the general reference character 700. Table 700 may include potentials in which various signals and supplies may be set when testing current characteristics of transistors in an n-channel array 200 and a p-channel array 600.

Figure 8:
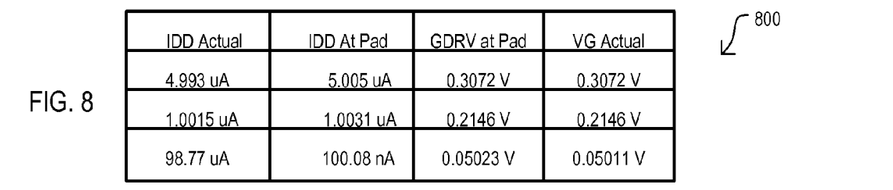
FIG. 8 is a table illustrating simulation results.

Referring now to FIG. 8, a table is set forth and designated by the general reference character 800. Table 800 sets forth simulation results of drain current IDD actually flowing through the transistor in the array being tested as well as the drain current IDD flowing from an output pad that may drive the global drain drive signal GDDRV as well as the actual gate potential on the transistor in the array being tested as well as the potential placed on the pad connected to gate drive signal GDRV. As can be seen, the actual current IDD is about the same as the current flowing from the output pad, with essentially matching actual gate line (GL-m) potential and gate drive signal GDRV potential indicating that the methods described above are substantially reducing leakage current that can otherwise make test results inaccurate.

Figure 9:
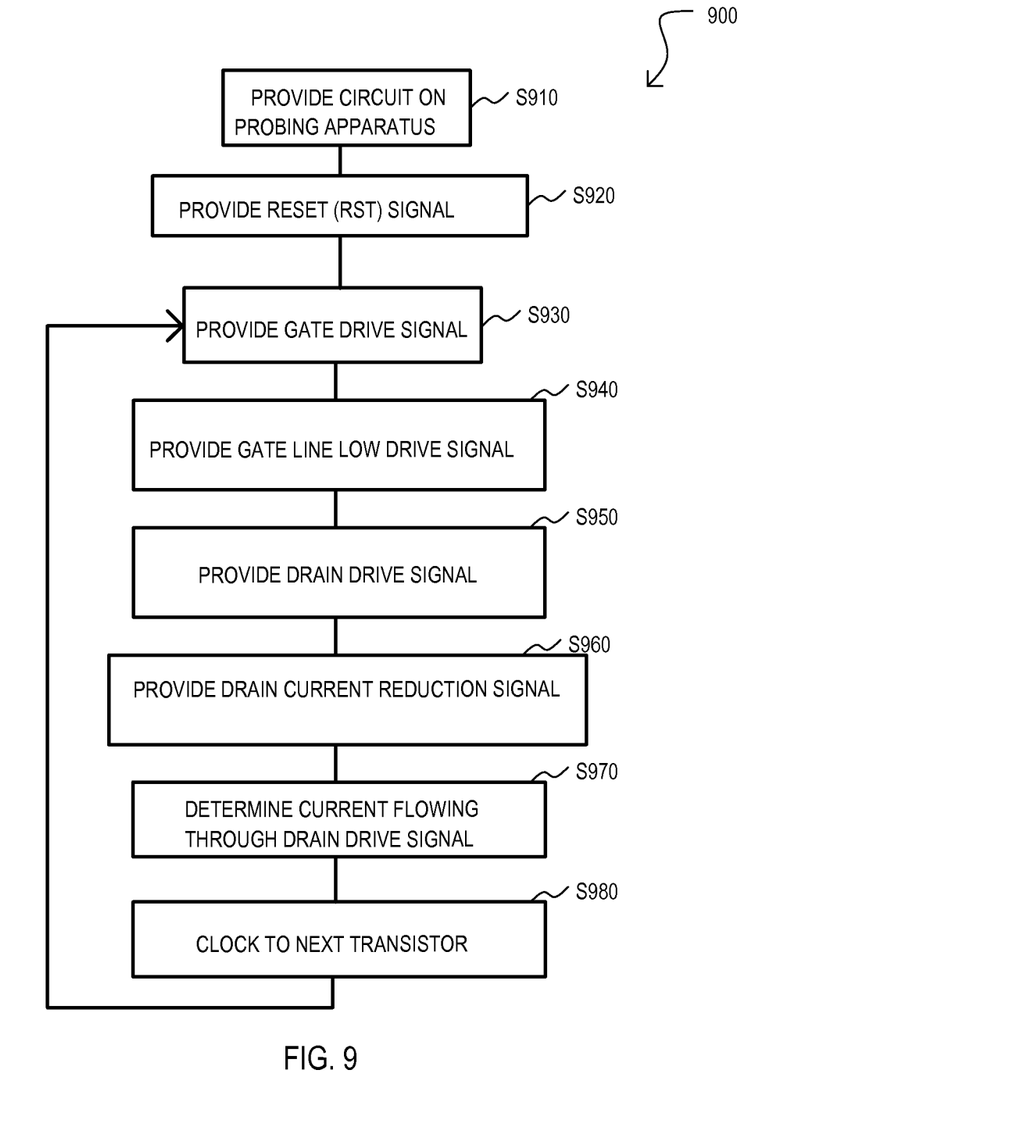
FIG. 9 is a flow diagram of a method of testing transistor characteristics according to an embodiment.

Referring now to FIG. 9, a flow diagram according to an embodiment is set forth and given the general reference character 900. Flow diagram 900 illustrates testing semiconductor circuit 100 of FIG. 1. Flow diagram 900 will now be described with reference to FIG. 9 in conjunction with FIGS. 1 and 2.

At step S910, the semiconductor circuit 100 may be provided on a probing apparatus. At step S920, a reset signal RST may be provided. In this way, address generator 190 may be reset to begin incrementing at the first address. At step S930, gate drive signal GDRV may be provided on a pad. At step S940, gate line low drive signal GTRACK may be provided on a pad. At step S950, global drain drive signal GDDRV may be provided on a pad. At step S960, drain current reduction signal DTRACK may be provided on a pad. At this point, the gate drive signal GDRV can be provided to the gate terminal of the transistor being tested, for instance, GL1 connected to transistor under test N(1,1). Global drain drive signal GDDRV may be provided to the drain line of the transistor being tested, for instance DL1 connected to transistor under test N(1,1). Also, at this time, the gate line low drive signal GTRACK can be provided to the gate lines (GL2-GL32) of transistors that are not selected and the drain current reduction signal can be provided to the drain lines (DL2-DL27) of transistors that are not selected. At step S970, the current flowing through global drain drive signal GDDRV may be determined. The current in step S970 may have a current value that is essentially the same as the current flowing through the transistor under test N(1,1). By driving a target current through drive signal at given drain voltage and slewing gate voltage, the gate voltage rises until the target current is hit, then the gate voltage can be measured for a selected drain voltage (typically value of 0.1V or Vdd).

At step S980, the clock signal CLK may transition through one clock cycle. In this way, address generator may output a subsequent address. The process may return to step S930 to test a subsequent transistor in accordance with the subsequent address. The test process may continue in this manner until all of the transistors in all of the arrays (110-0 to 110-7) may be tested.

The appearance of the phrase "in one embodiment" in various places in the specification do not necessarily refer to the same embodiment. The term "to couple" or "electrically connect" as used herein may include both to directly and to indirectly connect through one or more intervening components. While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art. Accordingly, the specifications and drawings are to be regarded in an illustrative rather than a restrictive sense.

What is claimed is:

1. A circuit, comprising:
   an array of transistors;
   a plurality of drain lines, each drain line coupled to a plurality of the array of transistors in a drain line direction; and
   a plurality of drain line multiplexers, each drain line multiplexer having a first drain multiplexer terminal coupled to a drain line drive signal, a second drain multiplexer terminal coupled to a leakage current reduction signal, and a third drain multiplexer terminal coupled to a corresponding one of the plurality of drain lines wherein each one of the plurality of drain line multiplexers includes a first pass gate having a first pass gate controllable impedance path coupled between the first drain multiplexer terminal and the third drain multiplexer terminal and a second pass gate having a second pass gate controllable impedance path coupled between the second drain multiplexer terminal and the third drain multiplexer terminal, and wherein when one of the plurality of drain line multiplexers provides a low impedance path between the first drain multiplexer terminal and the third drain multiplexer terminal, the other of the plurality of drain line multiplexers provides a low impedance path between the second drain multiplexer terminal and the third drain multiplexer terminal.

2. The circuit of claim 1, further including:
   a global drain drive signal; and
   a third pass gate having a controllable impedance path between the global drain drive signal and the first drain multiplexer terminal.

3. The circuit of claim 1, wherein:
   the array of transistors are n-channel insulated gate field effect transistors and the drain line drive signal has about the same potential as the leakage current reduction signal.

4. The circuit of claim 1, wherein:
   the array of transistors are p-channel insulated gate field effect transistors and the drain line drive signal has about the same potential as the leakage current reduction signal.

5. The circuit of claim 1, further including:

a plurality of gate lines, each gate line coupled to a plurality of the array of transistors in a gate line direction; and a plurality of gate line multiplexers, each gate line multiplexer having a first gate multiplexer terminal coupled to a first gate line drive signal, a second gate multiplexer terminal coupled to a second gate line drive signal, and a third gate multiplexer terminal coupled to a corresponding one of the plurality of gate lines wherein when one of the plurality of gate line multiplexers provides a low impedance path between the first gate multiplexer terminal and the third gate multiplexer terminal, the other of the plurality of gate line multiplexers provides a low impedance path between the second gate multiplexer terminal and the third gate multiplexer terminal.

6. The circuit of claim 5, wherein:

each one of the plurality of gate line multiplexers includes
a first pass gate having a first pass gate controllable impedance path coupled between the first gate multiplexer terminal and the third gate multiplexer terminal.

7. The circuit of claim 6, wherein:

each one of the plurality of gate line multiplexers further includes
a second pass gate having a first pass gate controllable impedance path coupled between the second gate multiplexer terminal and the third gate multiplexer terminal.

8. The circuit of claim 5, wherein:

the first gate line drive signal is bound between a first potential and a second potential and the second gate line drive signal has a potential that is outside the bounds of the first gate line drive signal.

9. The circuit of claim 5, wherein:

the plurality of drain line multiplexers receive a first power supply potential and the plurality of gate line multiplexers receive a second power supply potential.

10. The circuit of claim 1, wherein:

the plurality of transistors are insulated gate field effect transistors including a structure having a gate overlying a channel, wherein the channel comprises a substantially undoped channel having a relatively high mobility and a heavily doped screen layer lying a predetermined distance below the transistor gate.

11. The circuit of claim 1, each of the first pass gate and the second pass gate includes a transistor of which structure is different from a structure of a transistor included in the array of transistors.

12. The circuit of claim 1, each of the first pass gate and the second pass gate includes a NMOS transistor and a PMOS transistor, and the array of transistors includes memory transistors.

13. A circuit, comprising:

a first array of transistors;

a first plurality of drain lines, each drain line coupled to a plurality of the first array of transistors in a drain line direction; and a first plurality of drain line multiplexers, each one of the first plurality of drain line multiplexers having a first drain multiplexer terminal coupled to a drain line drive signal, a second drain multiplexer terminal coupled to a second drain line drive signal, and a third drain multiplexer terminal coupled to a corresponding one of the first plurality of drain lines each one of the first plurality of drain line multiplexers includes a first pass gate having a first pass gate controllable impedance path coupled between the first drain multiplexer terminal and the third drain multiplexer terminal and a second pass gate having a second pass gate controllable impedance path coupled between the second drain multiplexer terminal and the third drain multiplexer terminal, and wherein when one of the first plurality of drain line multiplexers provides a low impedance path between the first drain multiplexer terminal and the third drain multiplexer terminal, the other of the first plurality of first drain line multiplexers provides a low impedance path between the second drain multiplexer terminal and the third drain multiplexer terminal;

a second array of transistors;

a second plurality of drain lines, each drain line coupled to a plurality of the second array of transistors in a drain line direction; and a second plurality of drain line multiplexers, each one of the second plurality of drain line multiplexers having a first drain multiplexer terminal coupled to the drain line drive signal, a second drain multiplexer terminal coupled to the second drain line drive signal, and a third drain multiplexer terminal coupled to a corresponding one of the second plurality of drain lines wherein when one of the second plurality of drain line multiplexers provides a low impedance path between the first drain multiplexer terminal and the third drain multiplexer terminal, the other of the second plurality of first drain line multiplexers provides a low impedance path between the second drain multiplexer terminal and the third drain multiplexer terminal.

14. The circuit of claim 13, wherein:

the first array of transistors are n-channel insulated gate field effect transistors (IGFETs); and the second array of transistors are p-channel IGFETs.

15. The circuit of claim 13, wherein:

the first array of transistors include at least two transistors that are different types.

16. The circuit of claim 13, each of the first pass gate and the second pass gate includes a transistor of which structure is different from a structure of a transistor included in the first array of transistors.

17. The circuit of claim 13, each of the first pass gate and the second pass gate includes a NMOS transistor and a PMOS transistor, and the first array of transistors includes memory transistors.

* * * * *

UNITED STATES PATENT AND TRADEMARK OFFICE
CERTIFICATE OF CORRECTION

PATENT NO. : 9,449,967 B1  
APPLICATION NO. : 13/835327  
DATED : September 20, 2016  
INVENTOR(S) : Richard S. Roy Page 1 of 1

It is certified that error appears in the above-identified patent and that said Letters Patent is hereby corrected as shown below:

On the Title Page

Under (73): Please delete "Fujitsu Semiconductor Limited, Yokohama (JP)" and insert --Mie Fujitsu Semiconductor Limited, Kuwana (JP)--.

Signed and Sealed this  
Twenty-seventh Day of March, 2018

Andrei Iancu  
*Director of the United States Patent and Trademark Office*